(12) United States Patent
Mook

(10) Patent No.: US 6,452,169 B1
(45) Date of Patent: Sep. 17, 2002

(54) WIEN FILTER

(75) Inventor: Hindrik Willem Mook, Den Haag (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 09/582,247

(22) PCT Filed: Dec. 23, 1998

(86) PCT No.: PCT/NL98/00728
§ 371 (c)(1),
(2), (4) Date: Jun. 21, 2000

(87) PCT Pub. No.: WO99/34401
PCT Pub. Date: Jul. 8, 1999

(30) Foreign Application Priority Data

Dec. 24, 1997 (NL) .............................................. 1007902

(51) Int. Cl.⁷ ............................. H01J 49/46; H01J 37/05
(52) U.S. Cl. ........................................................ 250/298
(58) Field of Search ......................................... 250/298

(56) References Cited

FOREIGN PATENT DOCUMENTS

EP        0525927 A        2/1993

OTHER PUBLICATIONS

JP Abstracts vol. 014, No. 338 (E–0954), Apr. 26, 1990.

*Primary Examiner*—Jack Berman
*Assistant Examiner*—Johnnie L Smith
(74) *Attorney, Agent, or Firm*—Jeffrey D. Myers

(57) ABSTRACT

The invention relates to a Wien filter provided with electrodes for generating an electric field, and magnetic poles for generating a magnetic field, said electrodes and magnetic poles being positioned around and having a finite length along a filter axis, and being positioned around the filter axis such that electric and magnetic forces induced by the respective fields and exerted on an electrically charged particle moving substantially along the fileter axis at a certain velocity, take substantially an opposite direction to one another and are directed substantially perpendicular to the particle's direction of movement through the filter, said filter having along its axis two ends determined by the finite length of the electrodes and magnetic poles, and said ends both being terminated by a closing plate which is positioned substantially transversely to the filter axis and is provided with an aperture around the filter axis to allow the particle to enter into an exit from the filter. The closing plates are made from a material of low electric and magnetic resistance, and the distance from the closing plates to a plane halfway along and perpendicular to the filter axis is at most approximately equal to the shortest distance from the filter axis to the electrodes and/or magnetic poles.

4 Claims, 1 Drawing Sheet

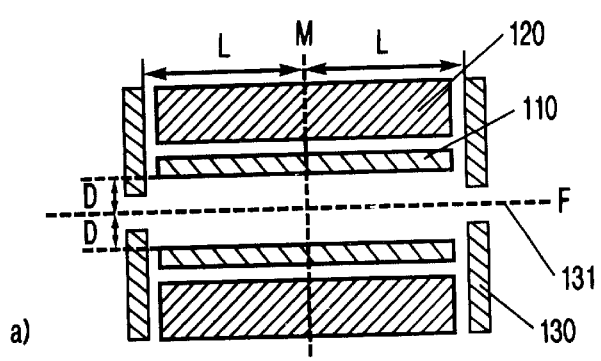
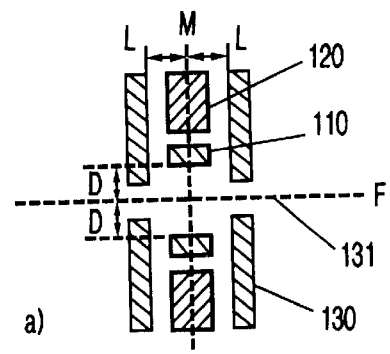
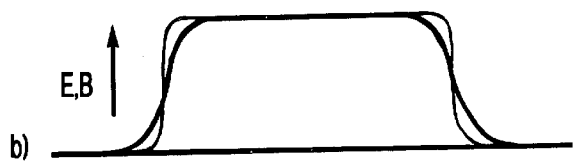
FIG-1
FIG-2
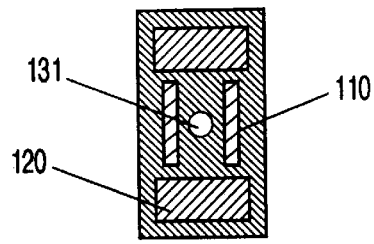
FIG-3
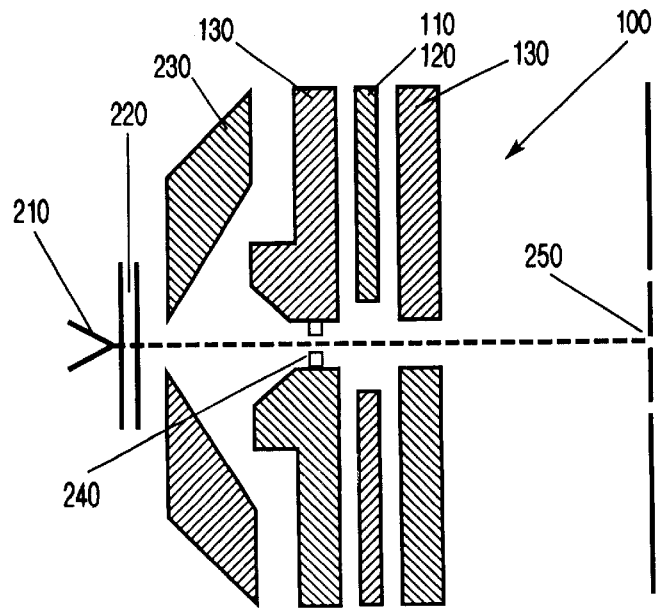
FIG-4

WIEN FILTER

The invention relates to a Wien filter provided with electrodes for generating an electric field, and magnetic poles for generating a magnetic field, said electrodes and magnetic poles being positioned around and having a finite length along a filter axis, and being positioned around the filter axis such that electric and magnetic forces induced by the respective fields and exerted on an electrically charged particle moving substantially along the filter axis at a certain velocity, take substantially an opposite direction to one another and are directed substantially perpendicular to the particle's direction of movement through the filter, said filter having along its axis two ends determined by the finite length of the electrodes and magnetic poles, and said ends both being terminated by a closing plate which is positioned substantially transversely to the filter axis and is provided with an aperture around the filter axis to allow the particle to enter into and exit from the filter.

Such a filter is known from practice. The electric force exerted on the particle is caused by the particle's electric charge and the electric field, and is directed in the same direction as or in a direction opposite to the electric field, depending on whether the particle's electric charge is positive or negative. The magnetic force exerted on the particle referred to, the so-called Lorentz force, is caused by the particle's charge, the particle's velocity and the magnetic field, the direction of the magnetic force being perpendicular to the direction of the velocity and the direction of the magnetic field, while in addition depending on whether the charge of the particle is positive or negative. As the electric field and the magnetic field are directed perpendicular to one another in the filter, the electric and magnetic forces will be exerted on the particle in the same or in the opposite direction. The electric and magnetic field have to be directed such that the electric and magnetic forces are exerted on the particle in opposite directions. The magnitude of the two forces depends on the magnitude of the particle's electric charge, the particle's velocity and the magnitude of the two fields. For a specific ratio of the magnitudes of the two fields, the nett force exerted on the particle at a specific velocity of the particle will be zero. At this velocity a particle will not be deflected from its original trajectory, while particles that do not have this velocity, will be deflected. This is the principle on which a Wien filter is based.

However, for the filter to work properly, the ratio of the magnitudes of the two fields along the filter axis must be constant. If this is not the case, there will always be positions where a nett force is exerted on the particle, resulting in an undesirable deflection of the particle to be filtered, which will result in a deterioration of the filter's efficacy. A well-designed shape and precise manufacture of the components of the Wien filter as well as a precise alignment, make it possible to obtain a constant ratio of the magnitudes of the two fields along the entire filter axis. The electrodes and magnetic poles may also affect each other's field. In order to avoid this, the electrodes and magnetic poles may be made both electric and magnetic. However, all these are not easily achievable measures, and there is no guarantee that the precise alignment is maintained during use of the filter.

It is the object of the invention to eliminate the above-mentioned disadvantages. To this end a Wien filter is provided, characterized in that the closing plates are made from a material of low electric and magnetic resistance, and that the distance from the closing plates to a plane halfway along and perpendicular to the filter axis is at most approximately equal to the shortest distance from the filter axis to the electrodes and/or magnetic poles. Thus the closing plates determine the shape of the electric and magnetic fields in such a manner as to guarantee that the course of the two fields over the filter axis is identical, and that the ratio of the magnitude of the electric and magnetic fields over the filter axis is constant. The manufacture and assembly of the Wien filter according to the invention is simple. The requirements for obtaining an effective filter with respect to the precision of the components and their alignment in the filter, are modest. This makes the filter according to the invention both cheaper and more readily applicable than the known filters.

It will be obvious that in order to obtain the electric field, an electric charge has to be provided on at least two electrodes, and said electric charge on the two electrodes has to be different. The different electric charges may be obtained by applying a potential difference across the respective electrodes. To the expert it will also be obvious that in order to obtain a magnetic field, there have to be at least two different magnetic poles, that is to say a magnetic north and south pole. The magnetic poles are formed by magnets, of which a magnetic pole is directed toward the filter axis.

Preferably the aperture in the closing plates has such a small dimension that the distance from a point located substantially on the filter axis to the edge of the aperture in one of the closing plates is at most approximately equal to the distance from said point to the electrodes and/or magnetic poles. The screening effect of the closing plates on the two fields is then not affected by the aperture in the closing plates.

In a preferred embodiment the closing plates extend past the electrodes and magnetic poles. The closing plates may also be accommodated in a housing surrounding the electrodes and magnetic poles and made from a material with low electric and magnetic resistance. The two fields are now enclosed within the closing plates or the housing, so that their effect is confined to the interior of the filter. A housing is a better safeguard for this purpose.

Other advantages of the Wien filter according to the invention will become obvious from the following description of an embodiment of the Wien filter according to the invention and a possible application of the filter.

The invention will now be explained in more detail with reference to the appended drawings, in which similar parts are indicated by identical reference numbers, and in which:

the FIGS. 1a and 1b show a schematic view of two combined cross sections through the filter axis, and the course of the electric and magnetic field along the filter axis of a Wien filter according to the prior art, respectively;

the FIGS. 2a and 2b show a schematic view of two combined cross sections through the filter axis, and the course of the electric and magnetic field along the filter axis of a Wien filter according to the invention, respectively;

FIG. 3 shows a cross section transverse to the filter axis of the Wien filter according to both the prior art and the invention; and FIG. 4 shows an application of the Wien filter according to the invention.

The Wien filters shown in the FIGS. 1a, 2a and 3 have two electrodes 110 and two magnets 120 provided around the filter axis F. One magnetic pole of the magnets 120 is directed toward the filter axis F. The effect of the filter is determined by the magnetic poles, therefore reference will mainly be made to the magnetic pole and not to the magnet. As magnets permanent and electromagnetic magnets may be used. Between the two electrodes 110 there is an electric field E, and between the two magnetic poles there is a magnetic field B present. The north pole of the one magnet is directed toward the south pole of the other magnet, and the two electrodes have a different charge due to the fact that different voltages are applied to them.

In the embodiments shown, both the electric and the magnetic fields are generated by an electric or a magnetic dipole, respectively, but in practice, the electric and/or the magnetic field is often generated by means of multi-poles having more than two poles. This is of no further consequence for the invention. Said multi-pole configuration can also be applied in the Wien filter according to the invention.

The above-mentioned figures also show closing plates 130, terminating the Wien filters at the ends. Around the filter axis F an aperture 131 is provided in the closing plates 130, to allow charged particles to pass through. The aperture in the closing plates must not be too large, but should have such a small dimension that the distance from a point located substantially on the filter axis to the edge of the aperture in one of the closing plates is at most substantially equal to the distance from said point to the electrodes and/or magnetic poles.

The closing plates 130 have a low electric and magnetic resistance. To this end the material from which the closing plates 130 are made should have the electrical properties of a metal, while having a relative magnetic permeability which differs significantly from the value one.

It is advisable to provide a housing (not shown in the figures) around the electrodes 110 and magnets 120, to further limit the effect of the fields outside the filter. The closing plates 130 then form a part of the housing.

In the FIGS. 1a and 2a, the shortest distance from the filter axis F to an electrode or a magnetic pole is indicated by D, and the distance from the closing plates 130 to a plane M halfway along and perpendicular to the filter axis between the two closing plates 130 is indicated by L.

On a charged particle moving over the filter axis F at a certain velocity, an electric and a magnetic force is exerted in a manner as explained in the introduction. At a specific ratio of the magnitudes of the electric field E and the magnetic field B, the ideal Wien filter will exert no nett force on the charged particle travelling at a specific velocity. This particle will exit the Wien filter along the filter axis, while particles having a different velocity, will have been affected by a lateral force and thus will have undergone a lateral displacement. Within a limited area around the filter axis the above-mentioned ratio will often be constant, so that filtering occurs not only on the filter axis.

In the prior art Wien filter, the electrodes 110 and the magnetic poles 120 are made long in the direction parallel to the filter axis F, while ensuring that said ratio of the electric field E and the magnetic field B covering a range in the middle part of the Wien filter, is constant. As can be seen in FIG. 1b, this ratio is not constant at the ends of the prior art filter, that is to say at the edges of the electric and the magnetic field. At these positions a nett force will be exerted on an electrically charged particle having a velocity such that it will experience no nett force in said range in the middle part of the filter. There will be no proper filtering effect.

The Wien filter according to the invention resolves this by making the distance L approximately equal to or smaller than the distance D, as can be seen in FIG. 2b. In addition, the closing plates 130 should be both electrically and magnetically conductive. This may be achieved by selecting a material with a low electric and magnetic resistance such as, for example, a nickel-iron alloy comprising 50% nickel and 50% iron. This material serves only as an example; other materials are also possible. The shape of the two fields shown in FIG. 2b, will in this situation be determined entirely, or almost entirely, by the closing plates 130 and not by the actual shape of the electrodes and magnetic poles, and the positioning of the electrodes 110 and the magnetic poles 120 is not particularly critical. The fact that the course of the two fields along the filter axis F is identical, implies that the ratio of the magnitudes of the two fields is constant.

The form of the two fields is now entirely determined by the edges of the fields ('fringe field'). In practice one does not speak of a particle with a certain velocity being filtered out by the Wien filter, but of a particle with a certain ratio of kinetic energy and mass. In the case where particles have an identical mass, only particles having a certain energy are filtered, so that the Wien filter may also be designated as energy filter or monochromator. In the remaining text the Wien filter according to the invention will be indicated as 'Fringe Field Monochromator' or FFM.

FIG. 4 shows a possible application of the 'Fringe Field Monochromator' after the electron source 210 of, for instance, an electron microscope. In such an electron microscope, electrons having a specific energy are used, for imaging extremely small structures. The 'Fringe Field Monochromator' in general is indicated by reference numeral 100.

The electron source 210 shown is a so-called Schottky source whose exceptionally small virtual magnitude is approximately 30 nm. The electron source 210 is followed by an extractor 220 for drawing the electrons from the source 210, a lens electrode 230 for focusing the electrodes, and the 'Fringe Field Monochromator' 100. A diaphragm 240 is provided in the aperture of the first closing plate 130 of the FFM 100 to limit the current of the electron beam. Behind the FFM 100 a membrane 250 is provided having a plurality of nanoslits with a width of approximately 150 nm, the width being determined by the magnification factor of the imaging system, which in this case is approximately five. The nanoslits can be made in thin membranes with the aid of lithographical techniques. With the aid of the lens electrode 230 the source 210 is imaged on the membrane 250. The loss of brightness will be minimal when the dispersion for the selected energy is approximately equal to the magnitude of the image of the source 210 on the membrane 250. When using an energy selection slit on an earth potential behind the accelerator of the microscope, it is possible to use an electrostatic or magnetic 'minilens' instead of a nanoslit in order to produce an enlarged image on a microslit behind the accelerator. In this way the brightness is guaranteed and the slit can be manipulated manually.

In the configuration shown in FIG. 4, the FFM is used in a so-called 'short field mode'. The FFM then acts as a deflector, the length of the fields being considerably shorter than the distance to the image of the source on the membrane. The ratio in the embodiment shown is approximately 1:10. An additional advantage in using the FFM as a deflector in the 'short field mode' is that the alignment of the filter with respect to the optical axis of the system is not particularly critical.

Due to the short magnets and electrodes, the focusing effect of the FFM will in general be small. Instead of a lateral dispersion as in the case of the prior art Wien filters having a greater focusing effect, there will be an angular dispersion of charged particles having different velocities.

To prolong the charged particle's lingering time in the FFM in order to obtain a greater dispersion, it is necessary that, preceding the FFM, a delaying potential is provided for the charged particles. This may be achieved by means of an appropriate potential difference between the extractor 220 and the FFM 100. The diaphragm 240 present in the first aperture of the FFM 100 limits the current of the electron beam in order to restrict the influence of coulomb interactions in the beam in the low-energy section where the electrons move at the retarded velocity. The low-energy section is formed between the first closing plate 130 of the FFM 100 and the membrane 250. In order to avoid the influence of coulomb interactions in the beam before the diaphragm 240, the lens electrode 230 is adjusted to an acceleration potential. It should be noted that the effect of the lens on the beam is a result of the combined effects of the potentials of the source 210, the extractor 220, the lens electrode 230 and the first closing plate 130 of the FFM 100.

One advantage of electrons hitting the membrane 250 at low energy is that a thin membrane suffices to serve as impenetrable barrier for said electrons and that at a low electron energy no X-rays are produced by the decelerated electrons. In this case the electrons are accelerated in an accelerating tube to the energy desirable for the electron microscope, after the membrane 250 with the nanoslits. In the embodiment shown in FIG. 4, the energy of the electrons in the low-energy section is in the order of 1 kev, and they are subsequently commonly accelerated to 100 keV or more in the accelerating tube.

A further advantage of the electrons having a low energy, thus a low beam potential, in the FFM is that it further reduces the requirements with respect to field precision and stability of the electrical supplies for the FFM, because these requirements are related to the correlation between the desired resolution and the beam potential.

In order to obtain the best possible brightness for the image after the membrane, the magnitude of the nanoslit has to correspond to the magnitude of the image of the source 210 on the membrane 250. As the exact magnitude of the source 210 is not known, the membrane is provided with different nanoslits having different widths. FIG. 4 shows three such nanoslits in the membrane 250. The nanoslits are not shown in the proper proportion with respect to the other components in FIG. 4. A nanoslit of the correct width can be selected by slightly deflecting the electrons with the desired energy and imaging them on the desired slit, which is possible because the FFM acts as a deflector. This is an advantage of applying the 'Fringe Field Monochromator' in the 'short field mode'. In this case a slight nett force has to be exerted on the electrons with the correct energy by slightly adjusting the ratio of the magnitudes of the two fields in the FFM. As the entire spot of the source 210 on the membrane 250 is in the order of 1 $\mu$m, the distance between the different nanoslits has to be at least 1 $\mu$m.

The embodiments described above must not be understood to limit the invention. The 'Fringe Field Monochromator' may be realized in various embodiments, all deemed to be within the scope of the present invention and the appended claims.

What is claimed is:

1. A Wien filter provided with electrodes for generating an electric field, and magnetic poles for generating a magnetic field, said electrodes and magnetic poles being positioned around and having a finite length along a filter axis, and being positioned around the filter axis such that electric and magnetic forces induced by the respective fields and exerted on an electrically charged particle moving substantially along the filter axis at a certain velocity, take substantially an opposite direction to one another and are directed substantially perpendicular to the particle's direction of movement through the filter, said filter having along its axis two ends determined by the finite length of the electrodes and magnetic poles, and said ends both being terminated by a closing plate made from a material of low electric and magnetic resistance, which is positioned substantially transversely to the filter axis and is provided with an aperture around the filter axis to allow the particle to enter into and exit from the filter, wherein the mutual distance of the electrodes and the mutual distance of the magnetic poles is larger or approximately equal to the mutual distance of the closing plates.

2. A Wien filter according to claim 1 wherein the dimension of the aperture in the closing plate is selected at a value such that the distance from a point lying at the section of the filter axis and a plane halfway between the closing plates and perpendicular to the filter axis to the edge of the aperture is at most approximately equal to the distance of said point to the electrodes and the magnetic poles.

3. A Wien filter according to claim 1 wherein the closing plates extend past the electrodes and magnetic poles.

4. A Wien filter according to claim 1 wherein the closing plates are accommodated in a housing surrounding the electrodes and magnetic poles and made from a material with low electric and magnetic resistance.

* * * * *